United States Patent
Huh et al.

(10) Patent No.: US 8,194,464 B2
(45) Date of Patent: Jun. 5, 2012

(54) PAGE BUFFER OF NONVOLATILE MEMORY DEVICE AND METHOD OF PERFORMING PROGRAM VERIFICATION OPERATION USING THE SAME

(75) Inventors: Hwang Huh, Gyeonggi-do (KR); Myung Cho, Gyeongsangnam-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 227 days.

(21) Appl. No.: 12/764,331

(22) Filed: Apr. 21, 2010

(65) Prior Publication Data

US 2010/0315879 A1 Dec. 16, 2010

(30) Foreign Application Priority Data

Jun. 12, 2009 (KR) ........................ 10-2009-0052260

(51) Int. Cl.
*G11C 11/34* (2006.01)
(52) U.S. Cl. .......... 365/185.22; 365/185.25; 365/185.12
(58) Field of Classification Search ............. 365/185.22, 365/185.25, 185.12, 189.02, 200, 189.05, 365/201, 230.03, 189.01, 230.02
See application file for complete search history.

(56) References Cited

U.S. PATENT DOCUMENTS 5,568,432 A * 10/1996 Wada ............................ 365/200
7,116,585 B2 * 10/2006 Vernenker et al. ....... 365/189.05

FOREIGN PATENT DOCUMENTS

KR 1020090020467 2/2009

OTHER PUBLICATIONS

Notice of Allowance issued from Korean Intellectual Property Office on May 31, 2011.

* cited by examiner

*Primary Examiner* — Dang Nguyen
(74) *Attorney, Agent, or Firm* — IP & T Group LLP

(57) ABSTRACT

A page buffer of a nonvolatile memory device comprises a sense unit coupled between the sense node and the bit lines of a memory cell array, comprising a number of memory cells, and configured to precharge the bit lines to different voltage levels in response to a page buffer sense signal of a first or second voltage level, a MUX unit configured to output the page buffer sense signal of the first or second voltage level in response to a control signal according to a value of program data, a flag latch configured to temporarily store the program data and to output the control signal to the MUX unit, and a main latch configured to sense the voltage levels of the bit lines via the sense node and to perform a program verification operation.

17 Claims, 3 Drawing Sheets

PAGE BUFFER OF NONVOLATILE MEMORY DEVICE AND METHOD OF PERFORMING PROGRAM VERIFICATION OPERATION USING THE SAME

CROSS-REFERENCE TO RELATED APPLICATION

Priority to Korean patent application number 10-2009-0052260 filed on Jun. 12, 2009, the entire disclosure of which is incorporated by reference herein, is claimed.

BACKGROUND

Exemplary embodiments relate to the page buffer of a nonvolatile memory device and a method of performing a program verification operation using the same and, more particularly, to the page buffer of a nonvolatile memory device and a method of performing a program verification operation using the same, which are capable of reducing the time that it takes to perform a program verification operation.

Recently, there has been an increasing demand for nonvolatile memory devices which can be electrically programmed and erased and which do not require the refresh function of rewriting data at specific intervals. Furthermore, to increase the degree of integration, attempts are being made to store data of more than one bit in a single cell.

A nonvolatile memory device capable of storing data of plural bits in one cell as described above is called a multi-level cell (MLC) nonvolatile memory device. For example, a MLC nonvolatile memory device capable of storing 2 bits can store four different data, such as 11, 10, 01, and 00, in one cell. Accordingly, the degree of integration can be increased from a logical viewpoint.

A nonvolatile memory device typically includes a memory cell array in which cells for storing data are arranged in a matrix form and a page buffer configured to write data into a specific cell of the memory cell array or to read data stored in a specific cell thereof. The page buffer includes pairs of bit lines coupled to the memory cells, a register configured to temporarily store data to be written into the memory cell array or to temporarily store data read from a specific cell of the memory cell array, a sense node configured to sense the voltage level of a specific bit line or a specific register, and a bit line selection unit configured to control the connection between the specific bit line and the sense node.

The above-described nonvolatile memory device may form a greater number of distributions of the threshold voltages in order to store a plurality of data in one memory cell during a program operation. For example, to store data of 3 bits in one memory cell, eight distributions of the threshold voltages must be implemented. To this end, during the program operation, program voltages corresponding to respective data values are supplied to the gate of the corresponding memory cell so that the memory cell has distributions of the threshold voltages corresponding to the respective data values.

To perform a program verification operation after the program operation, a sense operation has to be performed using different verification voltages, supplied to a word line, corresponding to the respective distributions of the threshold voltages. Accordingly, an MLC device capable of storing data of 3 bits requires at least eight verification operations. Consequently, as the number of data to be stored in one memory cell is increased, the number of program verification operations and the time that it takes to perform verification increases.

BRIEF SUMMARY

Exemplary embodiments relate to the page buffer of a nonvolatile memory device and a method of performing a program verification operation using the same, wherein when a program verification operation is performed on a nonvolatile memory device capable of storing data of plural bits in one memory cell, one verification voltage is used to verify two neighboring distributions of the threshold voltages, thereby being capable of reducing the time that it takes to perform the program verification operation.

The page buffer of a nonvolatile memory device according to an aspect of the present disclosure comprises a sense unit coupled between the sense node and the bit lines of a memory cell array, comprising a number of memory cells, and configured to precharge the bit lines to different voltage levels in response to a page buffer sense signal of a first or second voltage level, a MUX unit configured to output the page buffer sense signal of the first or second voltage level in response to a control signal according to a value of program data, a flag latch configured to temporarily store the program data and to output the control signal to the MUX unit, and a main latch configured to sense the voltage levels of the bit lines via the sense node and to perform a program verification operation.

The page buffer further comprises a precharge unit configured to precharge the sense node to a high voltage level in response to a precharge signal.

The sense unit is configured to precharge the bit lines using the sense node precharged to a high voltage level. Here, in the case in which selected memory cells of the memory cells are programmed to have a first state, the sense unit precharges a bit line coupled to the selected memory cells to a first voltage level. In the case in which the selected memory cells are programmed to have a second state having a higher distribution of threshold voltages than the first state, the sense unit precharges the bit line to a second voltage smaller than the first voltage level.

If the value of the program data corresponds to a distribution of the threshold voltages having the first state, the MUX unit outputs the page buffer sense signal of the first voltage level. If the value of the program data corresponds to a distribution of the threshold voltages having the second state which has a higher distribution of the threshold voltages than the first state, the MUX unit outputs the page buffer sense signal of the second voltage level smaller than the first voltage level.

The MUX unit comprises a first pass transistor configured to output the page buffer sense signal of the first voltage level in response to voltage levels of first and second nodes of the flag latch and a second pass transistor configured to output the page buffer sense signal of the second voltage level in response to voltage levels of the first and second nodes of the flag latch.

The MUX unit is configured to set Itrip values of the bit lines in response to the value of the program data.

If the value of the program data corresponds to a distribution of threshold voltages having a first state, the MUX unit outputs the page buffer sense signal of the first voltage level so that an Itrip value of the bit line is set to a first level. If the value of the program data corresponds to a distribution of threshold voltages having a second state which has a higher distribution of threshold voltages than the first state, the MUX unit outputs the page buffer sense signal of the second voltage level so that an Itrip value of the bit line is set to a second level smaller than the first level.

According to another aspect of this disclosure, there is provided a method of performing a program verification operation for verifying a first state or a second state on memory cells having a number of distributions of threshold voltages, comprising storing program data in a flag latch of a page buffer, precharging a bit line coupled to the memory cells in response to a value of the program data, supplying a verification voltage to the memory cells, and sensing and verifying a voltage level of the bit line. Here, if the value of the program data corresponds to a distribution of threshold voltages having the first state, the bit line is precharged to a first voltage level, and if the value of the program data corresponds to a distribution of threshold voltages having a second state which has a higher distribution of threshold voltages than the first state, the bit line is precharged to a second voltage level smaller than the first voltage level.

The distributions of the threshold voltages having the first state and the second state are immediate neighbors to each other.

Precharging a bit line coupled to the memory cells in response to a value of the program data comprises, if the value of the program data corresponds to a distribution of threshold voltages having a first state, outputting a page buffer sense signal of a first voltage level and setting an Itrip value of the bit line to a first level, and if the value of the program data corresponds to a distribution of threshold voltages having a second state which has a higher distribution of threshold voltages than the first state, outputting the page buffer sense signal of a second voltage level and setting the Itrip value of the bit line to a second level smaller than the first level.

DESCRIPTION OF EMBODIMENTS

Hereinafter, some embodiments of the present disclosure will be described in detail with reference to the accompanying drawings. The figures are provided to allow those having ordinary skill in the art to understand the scope of the embodiments of the disclosure.

Figure 1:
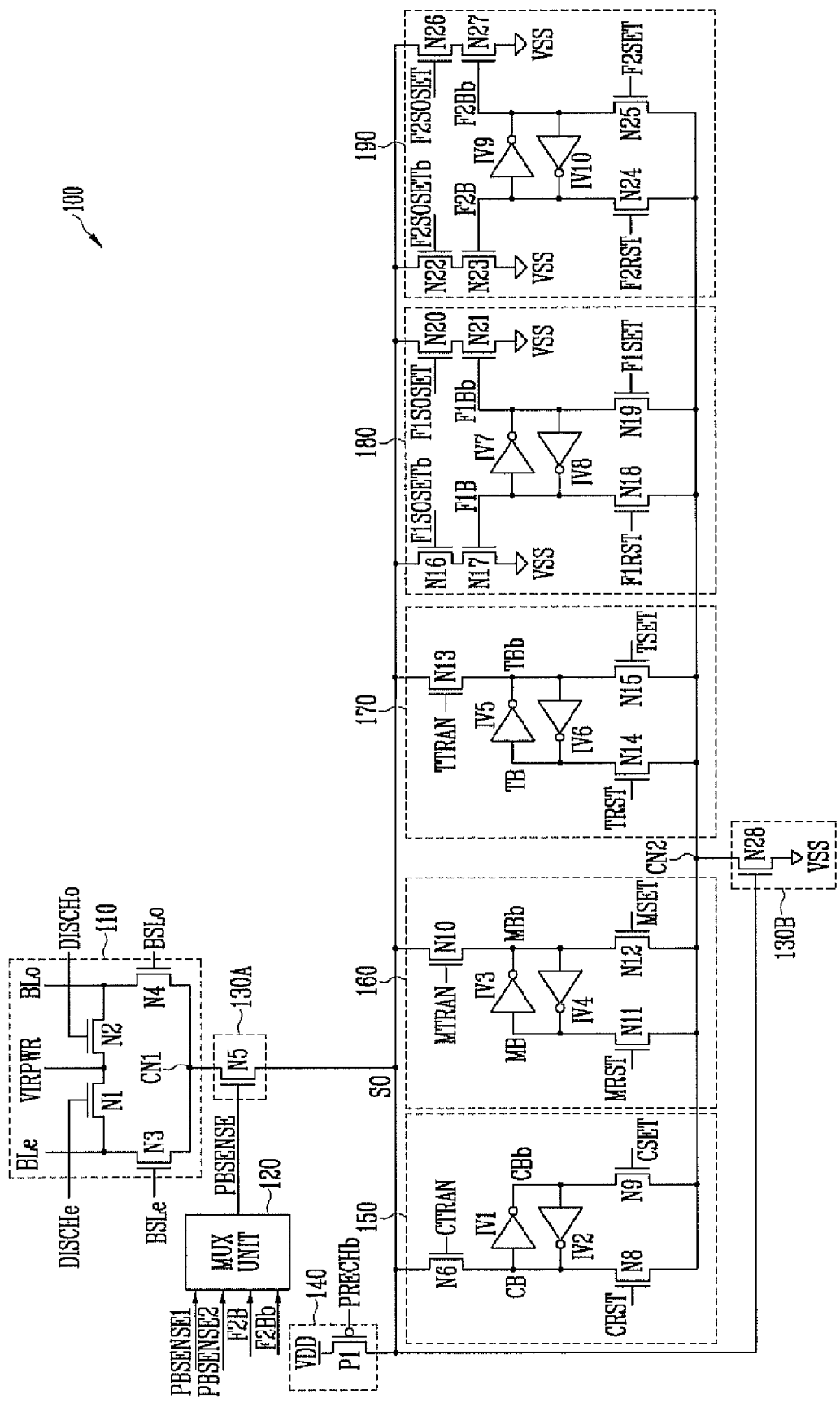
FIG. 1 is a circuit diagram of the page buffer of a nonvolatile memory device according to an embodiment of this disclosure.

FIG. 1 is a circuit diagram of the page buffer 100 of a nonvolatile memory device according to an embodiment of this disclosure.

Referring to FIG. 1, the page buffer 100 of the nonvolatile memory device includes a bit line selection unit 110, a MUX unit 120, a first sense unit 130A, a precharge unit 140, a cache latch 150, a main latch 160, a temporary latch 170, a first flag latch 180, a second flag latch 190, and a second sense unit 130B.

The bit line selection unit 110 includes a number of NMOS transistors N1 to N4. The NMOS transistor N1 and the NMOS transistor N2 are coupled in series between an even bit line BLe and an odd bit line BLo coupled to a memory cell array and are configured to supply a bias voltage VIRPWR to the respective bit lines BLe and BLo in response to respective discharge signals DISCHe and DISCHo. The NMOS transistors N3 and N4 are coupled between a first common node CN1 and the bit lines BLe and BLo and are configured to couple the first common node CN1 and the respective bit lines BLe and BLo in response to respective bit line selection signals BSLe and BSLo.

The MUX unit 120 is configured to receive a first sense signal PBSENSE1 and a second sense signal PBSENSE2 and to output a page buffer sense signal PBSENSE in response to the voltage levels of the nodes F2B and F2Bb of the second flag latch 190.

The first sense unit 130A includes an NMOS transistor N5 coupled between a sense node SO and the first common node CN1 of the bit line selection unit 110. The NMOS transistor N5 is configured to couple the first common node CN1 and the sense node SO together in response to the page buffer sense signal PBSENSE.

The precharge unit 140 includes a PMOS transistor P1 coupled between the sense node SO and a terminal for a voltage power source voltage VDD. The PMOS transistor P1 is configured to supply the power source voltage VDD to the sense node SO or to stop the supply of the power source voltage VDD to the sense node SO in response to a precharge signal PRECHb.

The cache latch 150 includes a number of NMOS transistors N6, N8, and N9 and inverters IV1 and IV2.

The inverters IV1 and IV2 are coupled in parallel between a node CB and a node CBb in a cross-coupled manner, thus forming a latch structure. The NMOS transistor N6 is coupled between the sense node SO and the node CB and is configured to transfer a voltage level of the node CB to the sense node SO in response to a transfer signal CTRAN. That is, the voltage level of the sense node SO is changed in response to a data value stored in the latch structure. The NMOS transistor N8 and the NMOS transistor N9 are coupled between a second common node CN2 and the nodes CB and CBb. The NMOS transistor N8 is configured to couple the node CB and the second common node CN2 together in response to a first cache control signal CRST. The NMOS transistor N9 is configured to couple the node CBb and the second common node CN2 together in response to a second cache control signal CSET.

The main latch 160 includes a number of NMOS transistors N10 to N12 and inverters IV3 and IV4.

The inverters IV3 and IV4 are coupled in parallel between a node MB and a node MBb in a cross-coupled manner, thus forming a latch structure. The NMOS transistor N10 is coupled between the sense node SO and the node MBb and is configured to operate in response to a transfer signal MTRAN, thus changing a voltage level of the sense node SO in response to a data value stored in the latch structure. The NMOS transistor N11 and the NMOS transistor N12 are coupled between the second common node CN2 and the nodes MB and MBb. The NMOS transistor N11 is configured to couple the node MB and the second common node CN2 together in response to a first main control signal MRST. The NMOS transistor N12 is configured to couple the node MBb and the second common node CN2 together in response to a second main control signal MSFT.

The temporary latch 170 includes a number of NMOS transistors N13 to N15 and inverters IV5 and IV6.

The inverters IV5 and IV6 are coupled in parallel between a node TB and a node TBb in a cross-coupled manner, thus forming a latch structure. The NMOS transistor N13 is coupled between the sense node SO and the node TBb and is configured to operate in response to a transfer signal TTRAN, thus changing a voltage level of the sense node SO in response to a data value stored in the latch structure. The NMOS transistor N14 and the NMOS transistor N15 are coupled between the second common node CN2 and the nodes TB and TBb. The NMOS transistor N14 is configured to couple the node TB and the second common node CN2 together in response to a first temporary control signal TRST. The NMOS transistor N15 is configured to couple the node TBb and the second common node CN2 together in response to a second temporary control signal TSET.

The first flag latch 180 includes a number of NMOS transistors N16 to N21 and inverters IV7 and IV8.

The inverters IV7 and IV8 are coupled in parallel between a node F1B and a node F1Bb in a cross-coupled manner, thus forming a latch structure. The NMOS transistor N16 and the NMOS transistor N17 are coupled in series between the sense node SO and a terminal for a ground power source Vss. The NMOS transistor N16 is turned on in response to a sense node set signal F1SOSETb. The NMOS transistor N17 is turned on in response to a voltage level of the node F1B, thus changing a voltage level of the sense node SO in response to a data value stored in the latch structure. The NMOS transistor N18 and the NMOS transistor N19 are coupled between the second common node CN2 and the nodes F1B and F1Bb. The NMOS transistor N18 is configured to couple the node F1B and the second common node CN2 together in response to a first flag control signal F1RST. The NMOS transistor N19 is configured to couple the node F1Bb and the second common node CN2 together in response to a second flag control signal F1SET. The NMOS transistor N20 and the NMOS transistor N21 are coupled in series between the sense node SO and the terminal for the ground power source Vss. The NMOS transistor N20 is turned on in response to a sense node set signal F1SOSET. The NMOS transistor N21 is turned on in response to a voltage level of the node F1Bb, thus changing a voltage level of the sense node SO in response to a data value stored in the latch structure.

The second flag latch 190 includes a number of NMOS transistors N22 to N27 and inverters IV9 and IV10.

The inverters IV9 and IV10 are coupled in parallel between the node F2B and the node F2Bb in a cross-coupled manner, thus forming a latch structure. The NMOS transistor N22 and the NMOS transistor N23 are coupled in series between the sense node SO and the terminal for the ground power source Vss. The NMOS transistor N22 is turned on in response to a sense node set signal F2SOSETb. The NMOS transistor N23 is turned on in response to a voltage level of the node F2B, thus changing a voltage level of the sense node SO in response to a data value stored in the latch structure. The NMOS transistor N24 and the NMOS transistor N25 are coupled between the second common node CN2 and the nodes F2B and F2Bb. The NMOS transistor N24 is configured to couple the node F2B and the second common node CN2 together in response to a first flag control signal F2RST. The NMOS transistor N25 is configured to couple the node F2Bb and the second common node CN2 together in response to a second flag control signal F2SET. The NMOS transistor N26 and the NMOS transistor N27 are coupled in series between the sense node SO and the terminal for the ground power source Vss. The NMOS transistor N26 is turned on in response to a sense node set signal F2SOSET. The NMOS transistor N27 is turned on in response to a voltage level of the node F2Bb, thus changing a voltage level of the sense node SO in response to a data value stored in the latch structure.

The sense unit 130B includes an NMOS transistor N28. The NMOS transistor N28 is coupled between the second common node CN2 and the terminal for the ground power source Vss and is turned on in response to a voltage level of the sense node SO, thus supplying the ground power source Vss to the second common node CN2.

Figure 2:
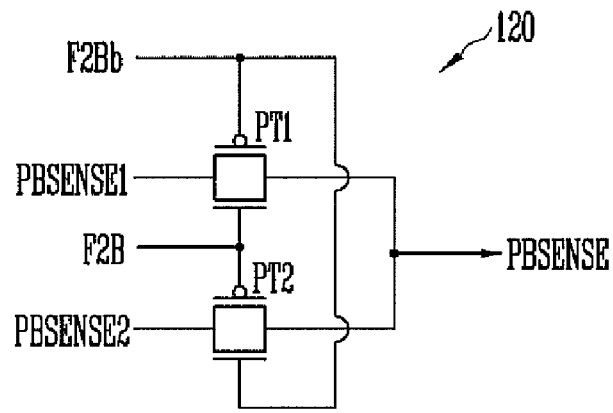
FIG. 2 is a detailed circuit diagram of a MUX unit shown in FIG. 1.

FIG. 2 is a detailed circuit diagram of the MUX unit 120 shown in FIG. 1.

Referring to FIG. 2, the MUX unit 120 includes pass transistors PT1 and PT2.

The pass transistor PT1 is configured to output the first sense signal PBSENSE1 as the page buffer sense signal PBSENSE in response to the voltage levels of the node F2B and the node F2Bb of the second flag latch 190. The pass transistor PT2 is configured to output the second sense signal PBSENSE2 as the page buffer sense signal PBSENSE in response to the voltage levels of the node F2B and the node F2Bb of the second flag latch 190. Here, the first sense signal PBSENSE1 has a higher voltage level than the second sense signal PBSENSE2. The voltage level of the first sense signal PBSENSE1 according to an exemplary embodiment is 2.4 V, and the voltage level of the second sense signal PBSENSE2 according to an exemplary embodiment is 1.9 V.

Figure 3:
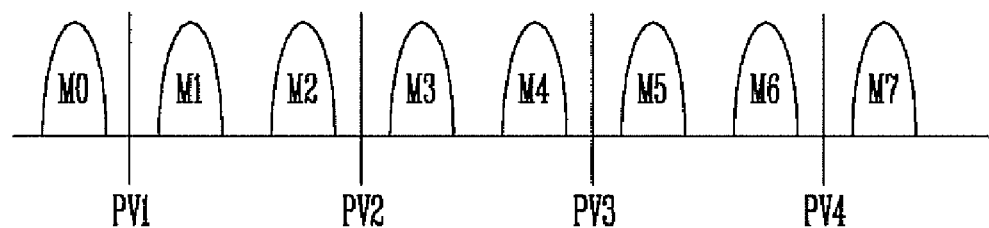
FIG. 3 is a diagram showing distributions of the threshold voltages of an X3 nonvolatile memory device.
Figure 4:
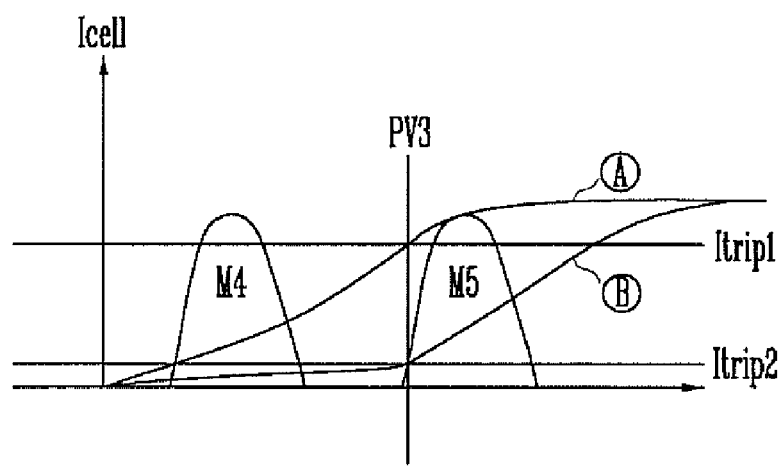
FIG. 4 is a graph illustrating the relationship between Itrip values and distributions of the threshold voltages.
Figure 5:
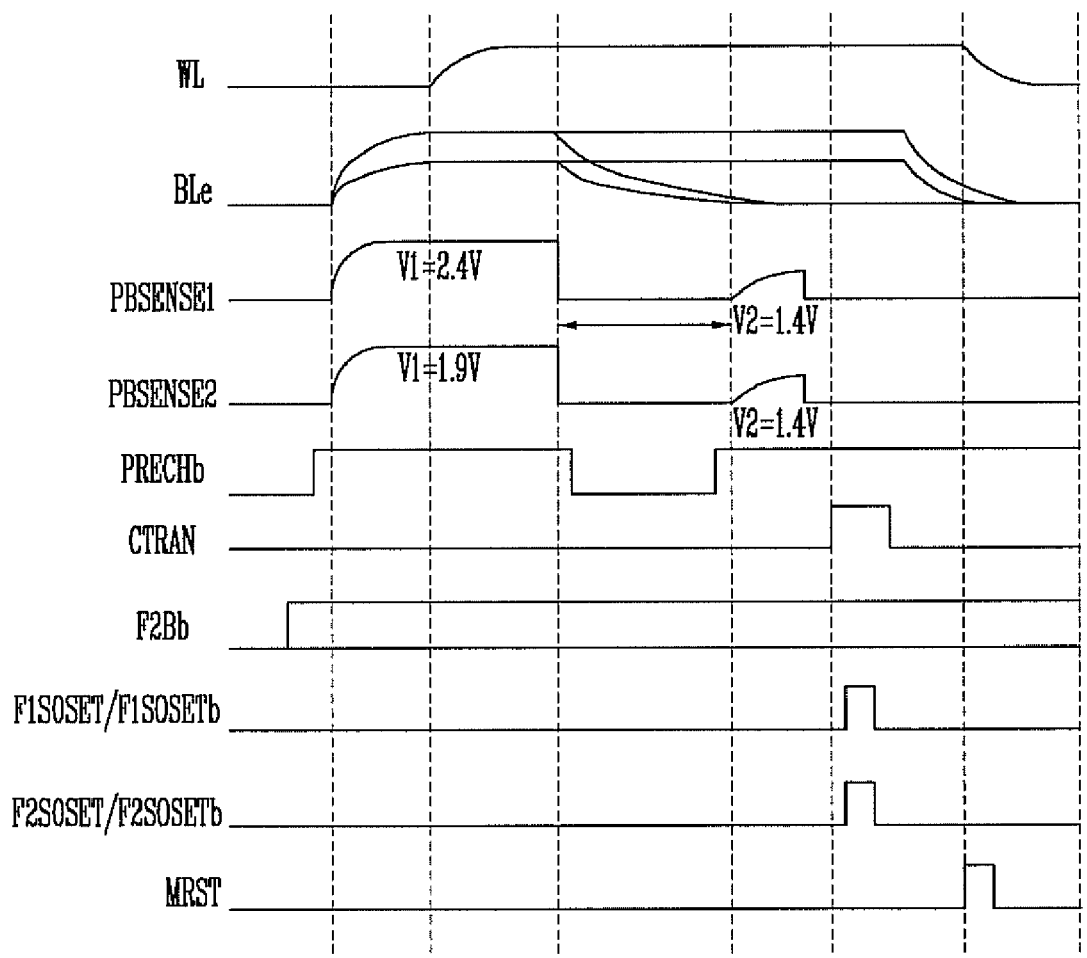
FIG. 5 is a waveform showing signals according to a program verification operation using the nonvolatile memory device according to an embodiment of this disclosure.

FIG. 3 is a diagram showing distributions of the threshold voltages of an X3 nonvolatile memory device. FIG. 4 is a graph illustrating the relationship between Itrip values and distributions of the threshold voltages. FIG. 5 is a waveform showing signals according to a program verification operation using the nonvolatile memory device according to an embodiment of this disclosure.

A program verification operation using the page buffer of the nonvolatile memory device according to an embodiment of this disclosure is described below with reference to FIGS. 1 to 5.

The program verification operation according to the embodiment of this disclosure is described in reference to a method of verifying memory cells, having distributions M4 and M5 of the threshold voltages shown in FIG. 3, as an example.

First, when a program operation is started, a data value to be programmed is stored in the first and second flag latches 180 and 190 of the page buffer 100. For example, in the case of memory cells which will be programmed to have the distribution M4 of the threshold voltages, a high level can be stored in the node F2B of the second flag latch 190. In the case of memory cells which will be programmed to have the distribution M5 of the threshold voltages, a low level can be stored in the node F2B of the second flag latch 190.

Table 1 below shows logic levels according to values of program data stored in the first and second flag latches 180 and 190.

TABLE 1

|  | M0 | M1 | M2 | M3 | M4 | M5 | M6 | M7 |
|---|---|---|---|---|---|---|---|---|
| CBb | 1 | 1 | 1 | 1 | 0 | 0 | 0 | 0 |
| F1Bb | 1 | 1 | 0 | 0 | 1 | 1 | 0 | 0 |
| F2Bb | 0 | 1 | 1 | 0 | 0 | 1 | 1 | 0 |

As can be seen from Table, during a program operation, different data values (i.e., different logic levels) are stored in the nodes F2B of the second flag latches 190 of respective groups of memory cells which will be programmed to have two neighboring distributions of the threshold voltages (i.e., M0 and M1, M2 and M3, M4 and M5, and M6 and M7).

To perform a program verification operation, the sense node SO is precharged to a high voltage level by supplying the precharge signal PRECHb of a low level to the precharge unit 140. Furthermore, the bit line selection signal BSLe of a high level is supplied to the NMOS transistor N3, thereby coupling the even bit line BLe and the first common node CN1 together.

Next, the page buffer sense signal PBSENSE is supplied to the first sense unit 130A. Thus, the sense node SO and the even bit line BLe are coupled together, and so the even bit line BLe is precharged. Here, the voltage level of the even bit line BLe that is precharged can be controlled in response to a voltage level of the page buffer sense signal PBSENSE.

For example, when a program verification operation is performed on memory cells which have been programmed to have the distribution M4 of the threshold voltages, the MUX unit 120 outputs the first sense signal PBSENSE1 having the voltage level of 2.4 V as the page buffer sense signal PBSENSE in response to the voltage level of the node F2B having a high level and the voltage level of the node F2Bb having a low level. Meanwhile, when a program verification operation is performed on memory cells which have been programmed to have the distribution M5 of the threshold voltages, the MUX unit 120 outputs the second sense signal PBSENSE2 having the voltage level of 1.9 V as the page buffer sense signal PBSENSE in response to the voltage level of the node F2B having a low level and the voltage level of the node F2Bb having a high level. Accordingly, the amount of current flowing from the sense node SO to the even bit line BLe via the first sense unit 130A is controlled, and so the even bit line BLe coupled to the memory cells programmed to have the distribution M4 of the threshold voltages and the even bit line BLe coupled to the memory cells programmed to have the distribution M5 of the threshold voltages are precharged to different levels. That is, the even bit line BLe coupled to the memory cells programmed to have the distribution M4 of the threshold voltages is precharged to a higher voltage level than the even bit line BLe coupled to the memory cells programmed to have the distribution M5 of the threshold voltages.

Next, the page sense signal PBSENSE of a low level is supplied to the first sense unit 130A. Next, a verification voltage PV3 is supplied to a word line WL coupled to the programmed memory cells, and so the voltage level of the even bit line BLe is maintained or discharged to a low level in response to a program state. The even bit line BLe coupled to the memory cells programmed to have the distribution M4 of the threshold voltages is precharged to a high level and is set to be high (i.e., an Itrip1 value) according to the following equation. Further, the even bit line BLe coupled to the memory cells programmed to have the distribution M5 of the threshold voltages is precharged to a low level, and is set to be low (i.e., an Itrip2 value) according to the following equation $$Itrip = C_{BL}(V1-V2)/tEVAL$$

where V1 is a voltage level of the page buffer sense signal PBSENSE to determine a precharge level of a bit line, V2 is a voltage level of the page buffer sense signal PBSENSE to sense the voltage level of a bit line, tEVAL is an evaluation time, and $C_{BL}$ is a bit line capacitance.

During an evaluation period in which the even bit line BLe is maintained at the high voltage level or discharged to a low level, the precharge signal PRECHb of a low level is supplied to the precharge unit 140. Accordingly, the precharge unit 140 precharges the sense node SO to a high voltage level.

After the evaluation period, the even bit line selection signal BSLe is supplied to the bit line selection unit 110, and the page buffer sense signal PBSENSE is supplied to the first sense unit 130A, thereby coupling the sense node SO and the even bit line BLe together. A voltage level of the even bit line BLe is sensed and stored in the main latch 160.

A pass or fail signal for the program verification operation is outputted in response to a data value stored in the main latch 160.

As described above, in the program verification operation using the nonvolatile memory device, different Itrip values are set in response to distributions of the threshold voltages of respective groups of memory cells. Thus, groups of memory cells having two neighboring distributions M4 and M5 of the threshold voltages can be verified at the same time using one verification voltage PV3. Accordingly, the time that it takes to perform a program verification operation can be reduced.

According to the present disclosure, in a program verification operation using a nonvolatile memory device capable of storing data of plural bits in one memory cell, two neighboring distributions of the threshold voltages of groups of memory cells are verified using one verification voltage. Accordingly, the time that it takes to perform a program verification operation can be reduced.

What is claimed is:

1. A page buffer of a nonvolatile memory device, the page buffer comprising:
    a sense unit coupled between a sense node and bit lines of a memory cell array, comprising a number of memory cells, and configured to precharge the bit lines to different voltage levels in response to a page buffer sense signal of a first or second voltage level;
    a MUX unit configured to output the page buffer sense signal of the first or second voltage level in response to a control signal according to a value of program data;
    a flag latch configured to temporarily store the program data and to output the control signal to the MUX unit; and
    a main latch configured to sense the voltage levels of the bit lines via the sense node and to perform a program verification operation.

2. The page buffer of claim 1, further comprising a precharge unit configured to precharge the sense node to a high voltage level in response to a precharge signal.

3. The page buffer of claim 1, wherein:
    the sense unit is configured to precharge the bit lines using the sense node precharged to a high voltage level, and
    in a case in which selected memory cells of the memory cells are programmed to have a first state, the sense unit precharges a bit line coupled to the selected memory cells to a first voltage level, and in a case in which the selected memory cells are programmed to have a second state having a higher distribution of threshold voltages than the first state, the sense unit precharges the bit line to a second voltage smaller than the first voltage level.

4. The page buffer of claim 1, wherein:
    if the value of the program data corresponds to a distribution of threshold voltages having a first state, the MUX unit outputs the page buffer sense signal of the first voltage level, and
    if the value of the program data corresponds to a distribution of threshold voltages having a second state which has a higher distribution of threshold voltages than the first state, the MUX unit outputs the page buffer sense signal of the second voltage level smaller than the first voltage level.

5. The page buffer of claim 1, wherein the MUX unit comprises:
    a first pass transistor configured to output the page buffer sense signal of the first voltage level in response to voltage levels of first and second nodes of the flag latch; and
    a second pass transistor configured to output the page buffer sense signal of the second voltage level in response to voltage levels of the first and second nodes of the flag latch.

6. The page buffer of claim 1, wherein the MUX unit is configured to set Itrip values of the bit lines in response to the value of the program data.

7. The page buffer of claim 1, wherein:
if the value of the program data corresponds to a distribution of threshold voltages having a first state, the MUX unit outputs the page buffer sense signal of the first voltage level so that an Itrip value of the bit line is set to a first level, and
if the value of the program data corresponds to a distribution of threshold voltages having a second state which has a higher distribution of threshold voltages than the first state, the MUX unit outputs the page buffer sense signal of the second voltage level so that an Itrip value of the bit line is set to a second level smaller than the first level.

8. A page buffer of a nonvolatile memory device, the page buffer comprising:
a bit line selection unit coupled to bit lines of a memory cell array comprising a number of memory cells;
a sense unit coupled between the bit lines and a sense node and configured to precharge the bit lines to set precharge voltage levels using a voltage level of the sense node in response to a page buffer sense signal of a first or second voltage level;
a MUX unit configured to output the page buffer sense signal of the first or second voltage level in response to a control signal according to a value of program data;
a flag latch configured to temporarily store the program data and to output the control signal to the MUX unit; and
a main latch configured to sense the voltage levels of the bit lines via the sense node and to perform a program verification operation.

9. The page buffer of claim 8, further comprising a precharge unit configured to precharge the sense node to a high voltage level in response to a precharge signal.

10. The page buffer of claim 8, wherein:
the sense unit is configured to precharge the bit lines using the sense node precharged to a high voltage level, and
in a case in which selected memory cells of the memory cells are programmed to have a first state, the sense unit precharges a bit line coupled to the selected memory cells to a first voltage level, and in a case in which the selected memory cells are programmed to have a second state having a higher distribution of threshold voltages than the first state, the sense unit precharges the bit line to a second voltage smaller than the first voltage level.

11. The page buffer of claim 8, wherein:
if the value of the program data corresponds to a distribution of threshold voltages having a first state, the MUX unit outputs the page buffer sense signal of the first voltage level, and
if the value of the program data corresponds to a distribution of threshold voltages having a second state which has a higher distribution of threshold voltages than the first state, the MUX unit outputs the page buffer sense signal of the second voltage level smaller than the first voltage level.

12. The page buffer of claim 8, wherein the MUX unit comprises:
a first pass transistor configured to output the page buffer sense signal of the first voltage level in response to voltage levels of first and second nodes of the flag latch; and
a second pass transistor configured to output the page buffer sense signal of the second voltage level in response to voltage levels of the first and second nodes of the flag latch.

13. The page buffer of claim 8, wherein the MUX unit is configured to set Itrip values of the bit lines in response to the value of the program data.

14. The page buffer of claim 8, wherein:
if the value of the program data corresponds to a distribution of threshold voltages having a first state, the MUX unit outputs the page buffer sense signal of the first voltage level so that an Itrip value of the bit line is set to a first level, and
if the value of the program data corresponds to a distribution of threshold voltages having a second state which has a higher distribution of threshold voltages than the first state, the MUX unit outputs the page buffer sense signal of the second voltage level so that an Itrip value of the bit line is set to a second level smaller than the first level.

15. A method of performing a program verification operation for verifying a first state or a second state on memory cells having a number of distributions of threshold voltages, the method comprising:
storing program data in a flag latch of a page buffer;
precharging a bit line coupled to the memory cells in response to a value of the program data;
supplying a verification voltage to the memory cells; and
sensing and verifying a voltage level of the bit line,
wherein if the value of the program data corresponds to a distribution of threshold voltages having the first state, the bit line is precharged to a first voltage level, and if the value of the program data corresponds to a distribution of threshold voltages having a second state which has a higher distribution of threshold voltages than the first state, the bit line is precharged to a second voltage level smaller than the first voltage level.

16. The method of claim 15, wherein the distributions of the threshold voltages having the first state and the second state are immediate neighbors to each other.

17. The method of claim 15, wherein precharging a bit line coupled to the memory cells in response to a value of the program data comprises:
if the value of the program data corresponds to a distribution of threshold voltages having a first state, outputting a page buffer sense signal of a first voltage level and setting an Itrip value of the bit line to a first level, and
if the value of the program data corresponds to a distribution of threshold voltages having a second state which has a higher distribution of threshold voltages than the first state, outputting the page buffer sense signal of a second voltage level and setting the Itrip value of the bit line to a second level smaller than the first level.

* * * * *